United States Patent [19]

Tanigawa et al.

[11] Patent Number: 5,108,783
[45] Date of Patent: Apr. 28, 1992

[54] PROCESS FOR PRODUCING SEMICONDUCTOR DEVICES

[75] Inventors: Makoto Tanigawa; Hidehisa Tateoka, Tenri; Keizo Sakiyama, Kashihara; Shigeo Ohnishi, Nara; Yoshimitsu Yamauchi, Nara; Kenichi Tanaka, Nara, all of Japan

[73] Assignee: Sharp Kabushiki Kaisha, Osaka, Japan

[21] Appl. No.: 454,368

[22] Filed: Dec. 21, 1989

[30] Foreign Application Priority Data

Dec. 23, 1988 [JP] Japan .................. 63-326467

[51] Int. Cl.$^5$ .......................................... H01L 21/76
[52] U.S. Cl. ........................................ 437/63; 437/67
[58] Field of Search ................................ 437/67, 63

[56] References Cited

U.S. PATENT DOCUMENTS

| | | | |
|---|---|---|---|
| 4,140,558 | 2/1979 | Murphy et al. | 437/67 |
| 4,466,180 | 8/1984 | Sollof | 437/67 |
| 4,569,701 | 2/1986 | Oh | 437/67 |
| 4,711,017 | 12/1987 | Lammert | 437/72 |

FOREIGN PATENT DOCUMENTS

| | | | |
|---|---|---|---|
| 0112489 | 7/1984 | European Pat. Off. | 437/67 |
| 0134443 | 8/1983 | Japan | 437/67 |
| 0166541 | 7/1987 | Japan | 437/67 |
| 0124547 | 5/1988 | Japan | 437/67 |
| 63-1045 | 6/1988 | Japan | |
| 7900684 | 9/1979 | World Int. Prop. O. | 437/67 |

OTHER PUBLICATIONS

"A Variable-Size Shallow Trench Isolation (STI) Technology with Diffused Sidewall Doping for Submicron CMOS", CH 2528-8/88, 92-95 IDEM 88, IEEE (1988).
"New Effects of Trench Isolated Transistor using Side-Wall Gates", CH 2515-5/87, 736-739-IDEM 87, IEEE (May 1987).

Primary Examiner—Olik Chaudhuri
Assistant Examiner—G. Fourson
Attorney, Agent, or Firm—Sandler, Greenblum & Bernstein

[57] ABSTRACT

A process for producing a semiconductor device including the steps of:
(a) forming a trench in a semiconductor substrate at a portion thereof where an isolating zone is to be formed,
(b) doping the substrate with an impurity element from the inner wall thereof defining the trench to form a high-concentration impurity diffused region, and
(c) etching the bottom surface of the trench to increase the depth of the trench, thereby separating the impurity diffused region to form the isolating zone, which is useful for the fabrication of semiconductor devices of high integration with low well resistance.

10 Claims, 17 Drawing Sheets

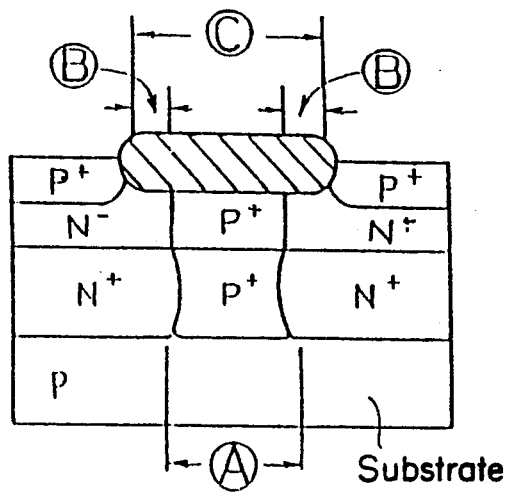
Fig. 6a
Fig. 6b
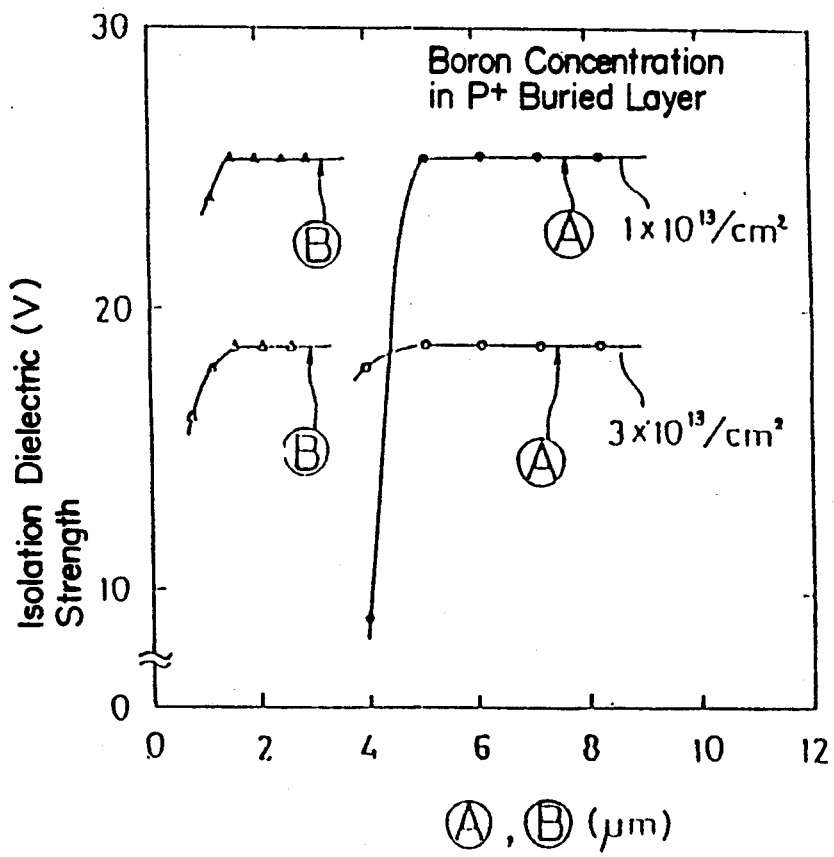

PROCESS FOR PRODUCING SEMICONDUCTOR DEVICES

BACKGROUND OF THE INVENTION

1. Field of the Invention

The present invention relates to a process for producing semiconductor devices, and more particularly to improvements in forming an impurity diffused region (hereinafter referred to as a "well") as isolated to provide therein components of a semiconductor device. The production process of the present invention is useful as a process for fabricating semiconductor devices of high integration which are low in well resistance.

2. Background of the Invention

In producing semiconductor devices, the well is formed usually by the step of introducing impurities into a semiconductor substrate from its surface side as by ion implantation, and a diffusion step which involves heating for a prolonged period of time.

With bipolar semiconductor devices, especially bipolar CMOS devices, it is required to reduce the collector resistance by lowering the well resistance, especially the internal resistance of the well.

However, when the well is formed only by diffusing impurities from the surface side of the substrate as stated above, the impurity concentration of the substrate surface is limited (usually to about $10^{16}$ atoms/cm$^3$ if highest) to inherently set an upper limit on the well concentration, consequently presenting difficulties in lowering the well resistance to not higher than 700 to 2000 ohms/cm$^2$ in terms of sheet resistance. As the complexity of CMOS devices increases, therefore, there arises the problem of impaired latchup resistance.

With semiconductor devices of the type mentioned, accordingly, the well resistance is reduced by forming an impurity diffused region of high concentration in the form of a buried layer, then forming an epitaxial layer, and thereafter introducing and diffusing impurities into the epitaxial layer to form a well of (buried) double-layer structure.

Further such buried wells are isolated by utilizing PN junctions or by a selective oxidation process termed the LOCOS process. Presently the LOCOS process is generally employed since the isolation resorting to PN junctions encounters difficulties in fabricating semiconductor devices of higher density with higher operating speed.

Bipolar semiconductor devices are produced by the above conventional process, for example, through the steps to be described below with reference to FIG. 5a to FIG. 5h.

First as shown in FIG. 5a, an N+ layer (buried layer) 152 having a high impurity concentration is formed in a P-type silicon substrate 151 using a resist layer (or silicon oxide layer) 153 as a mask.

Next as seen in FIG. 5b, a P-type epitaxial layer 154 is grown, which is further doped with N-type impurities by ion injection and thermal diffusion to form an N− well 155 as shown in FIG. 5c. The well is then isolated by the LOCOS process as seen in FIG. 5d. Indicated at 156 is a LOCOS oxide film.

A P-type base region 157 is formed in the N− well 155 as shown in FIG. 5e. Next, a high-concentration N-type layer (collector contact portion) 158 is formed for connection to collector wiring as shown in FIG. 5f. Further as shown in FIG. 5g, a high-concentration P-type layer (base contact portion) 159 is formed for connection to base wiring. Finally as shown in FIG. 5h, an emitter region 160 is formed, followed by connection of base wiring 161, emitter wiring 162 and collector wiring 163 to the base contact portion 159, emitter region 160 and collector contact portion 158, respectively.

The above process wherein the buried well is used realizes a reduction in well resistance, but requires cumbersome time-consuming steps such as formation of the buried layer and epitaxial growth, consequently making the semiconductor device costly. The process has another problem in that the defects that could occur in the epitaxial layer would lead to a lower yield.

Additionally with the LOCOS process which is widely utilized for well isolation, the well isolation zone becomes enlarged, for example, owing to the occurrence of so-called bird's beak in the form of a laterally developed oxide film, consequently presenting difficulties in providing semiconductor devices of higher complexity. Further in the case where well isolation is to be accomplished by the LOCOS process in the fabrication of bipolar semiconductor devices, the required isolation dielectric strength can not be obtained unless the well isolation width is considerably large. FIGS. 6 (a) and (b) show that well isolation by the LOCOS process requires an isolation width of about 6 to about 10 micrometers.

To overcome the problem encountered in well isolation, Unexamined Japanese Patent Publication SHO 63-1045 discloses a method of effecting well isolation by forming a trench in the well isolation zone and burying an insulating material in the trench. The publication SHO 63-1045 states that the method achieves a great decrease in the width of well isolation zone and that the trench is usable also for forming memory capacitors ("A VARIABLE-SIZE SHALLOW TRENCH ISOLATION (STI) TECHNOLOGY WITH DIFFUSED SIDEWALL DOPING FOR SUBMICRON CMOS," CH2528-8/88, 92-95-IEDM 88, IEEE (1988); NEW EFFECTS OF TRENCH ISOLATED TRANSISTOR USING SIDE-WALL GATES," CH2515-5/87, 736-739-IEDM 87, IEEE (1987)). However, there has not been any case wherein such a trench is utilized for forming wells.

SUMMARY OF THE INVENTION

The main object of the present invention which has been accomplished in view of the foregoing situation is to provide a process for producing a semiconductor device without resorting to epitaxial growth which requires a long period of time and is likely to develop defects, the semiconductor device produced being effectively decreased in well resistance and having an isolating zone of effectively diminished width.

Accordingly, the present invention provides a process for producing a semiconductor device including the steps of:

(a) forming a trench in a semiconductor substrate at a portion thereof where an isolating zone is to be formed, (b) doping the substrate with an impurity element from the inner wall thereof defining the trench to form a high-concentration impurity diffused region, and (c) etching the bottom surface of the trench to increase the depth of the trench to separate the impurity diffused region and form the isolating zone.

According to the present invention, an impurity element is diffused into the semiconductor substrate from the trench defining inner wall thereof, whereby a buried wall of low resistance can be readily formed with little or no influence on the impurity concentration of the substrate surface. At the same time, a well isolating zone can be formed with a reduced width. Consequently, the present process affords semiconductor devices of higher complexity, while CMOS devices can be fabricated with improved latchup resistance.

Moreover, bipolar semiconductor devices or bipolar CMOS devices can be produced according to the invention by a simpler process at a lower cost in a higher yield since there is no need to form any epitaxial layer or buried layer unlike the conventional process.

BRIEF DESCRIPTION OF THE DRAWINGS

FIG. 6 (a) is a fragmentary view in section of a conventional bipolar semiconductor device wherein well isolation is conducted by the LOCOS process; and FIG. 6 (b) is a diagram showing the relationship between the isolation width and the isolation dielectric strength as determined for the conventional semiconductor device.

DESCRIPTION OF THE PREFERRED EMBODIMENTS

Figure 1A:
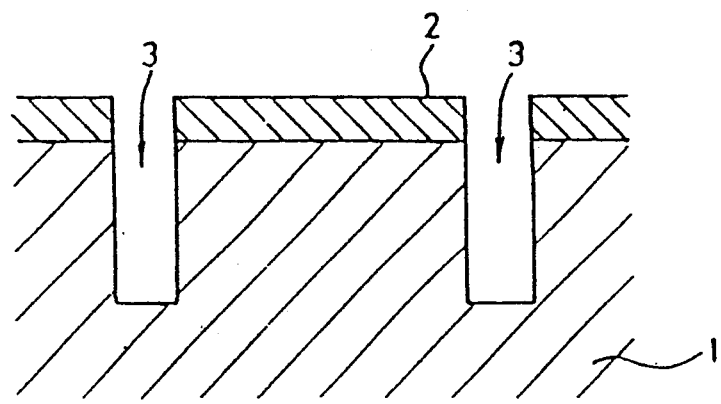
FIGS. 1a to 1j are fragmentary views in section showing stepwise a first embodiment of the invention, i.e., a process for producing a semiconductor device.

According to the present invention, a trench is formed in the step (a) by ion beam etching, RIE or like anisotropic etching method. Especially when a silicon wafer is used as the semiconductor substrate, the trench can be formed favorably by RIE with use of $SiCl_4 + SF_6$ gas. Generally it is suitable that the trench be 0.8 to 1.0 micrometer in width and 2.0 to 3.0 micrometers in depth.

The trench is formed in the portion of the substrate where an isolating zone is to be provided, and is usually linear, U-shaped or rectangular in plan view.

The substrate is doped in the step (b) with an N-type impurity element or P-type impurity element. The doping can be accomplished by a known method of solid-phase or vapor-phase thermal diffusion, or ion implantation and thermal diffusion. It is suitable that the high-concentration impurity diffused region to be formed be usually about $10^{17}$ to $10^{20}$ atoms/cm$^3$ in impurity concentration.

The dopant is diffused into the substrate from the inner wall thereof defining the trench, e.g., from a portion of the trench defining wall. Such a portion is suitably a part of the trench defining inner wall including the bottom surface of the trench. When the doping is to be done in this way from one portion of the inner wall, the present process may include, between the steps (a) and (b), the step of forming a protective film on the inner wall by thermal oxidation or CVD and subsequently etching the trench bottom surface to obtain a portion left uncovered with the protective film. The dopant is then diffused into the substrate from the uncovered portion. The protective film means a masking film capable of preventing doping, such as silicon oxide or like oxide film, or silicon nitride or like nitride film. The bottom surface of the trench may be etched not only to an extent to remove the protective film but also to such an extent as to give an increased depth to the trench. By adjusting the depth in this way, the size of the impurity diffused region is also controllable.

The etching step (c) is performed by the above-mentioned anisotropic etching method to increase the depth of the trench at least to such an extent that the high-concentration impurity diffused region formed around the trench in the substrate is separated into portions on the respective opposite sides of the trench in its cross section. The depth of the trench is so increased as to completely isolate the well, such that the bottom of the trench reaches the low-concentration portion of the substrate.

Semiconductor components are formed in a region of the substrate defined by the isolating zone thus formed to fabricate a semiconductor device. The components can be formed by using known methods, especially by utilizing a well which is formed by introducing impurities into the semiconductor substrate from the surface thereof by ion implantation, followed by thermal diffusion to provide a low-concentration impurity diffused region. The well (low-concentration impurity diffused region) is formed by a step preceding, between or following the steps (a) to (c).

The trench providing the isolating zone may be filled with a silicon oxide layer or polysilicon-containing silicon oxide layer as will be described below so as to obtain specified dielectric strength.

The present invention will be described below with reference to embodiments.

The first embodiment to be described with reference to FIG. 1a to FIG. 1j is adapted to fabricate a bipolar transistor in a well, whereas a MOS transistor or the like can also be provided in the well.

Referring to FIG. 1a, a patterned silicon oxide film 2 is first formed over the surface of a P-type silicon substrate 1, and a trench 3, rectangular when seen from above, is then formed in the substrate by RIE (reactive ion etching) with the silicon oxide film 2 serving as a mask. Although only one trench is shown in FIG. 1, a multiplicity of similar trenches are formed in the substrate when required. The trench 3 is about 2 to about 3 micrometers in depth and about 0.8 about 1.0 micrometer in width.

Figure 1B:
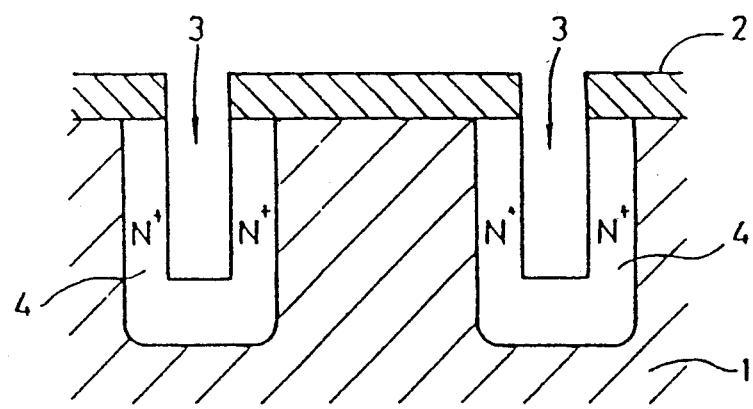

As shown in FIG. 1b, an N-type impurity element is diffused into the substrate 1 from the inner wall thereof defining the trench 3 to form a high-concentration impurity diffused region 4. The impurity element is diffused, for example, by solid-phase diffusion using a solid source containing phosphorus or arsenic, or vapor-phase diffusion using a liquid source such as POCl$_3$, as suitably selected according to the kind, performance, etc. of the semiconductor component to be formed later. In the present case, phosphorus is diffused by vapor-phase diffusion to an impurity concentration of about $10^{20}$ atoms/cm$^3$. It is desired to make the impurity diffused region 4 as large as possible insofar as the component forming surface area of the substrate remains unaffected. More specifically, it is suitable that the impurity diffused region 4 be 2 to 3 micrometers in width.

When a bipolar semiconductor device is to be produced by the present embodiment, the portion of the region 4 appearing at the surface of the substrate provides connection to collector wiring, hence a great convenience.

Figure 1C:
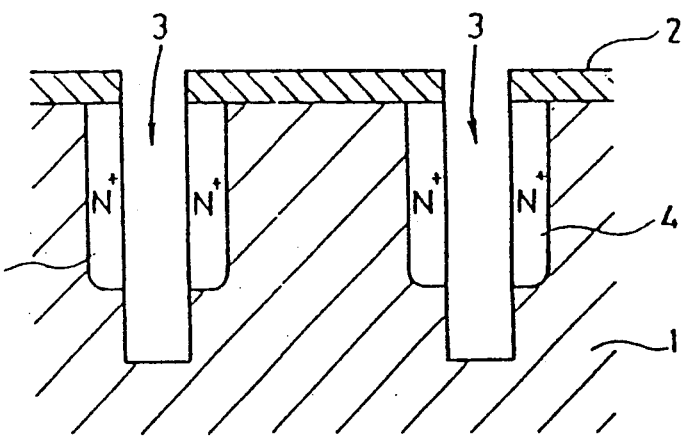
Figure 1D:
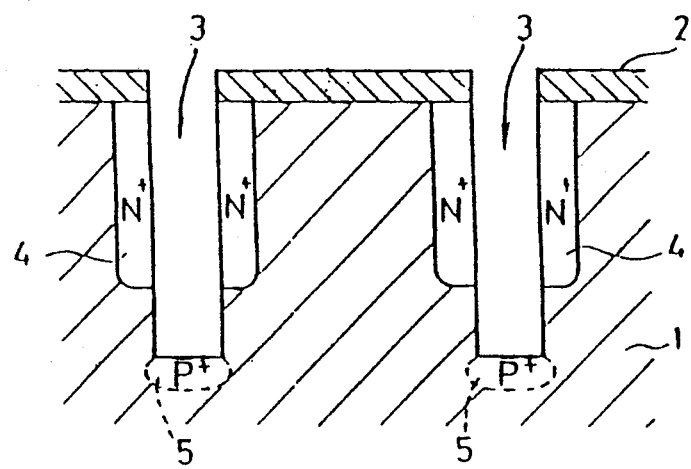

Next as seen in FIG. 1c, the trench 3 is additionally etched by anisotropic etching to a greater depth. Preferably, the trench 3 is given a depth of about 4 to about 6 micrometers by the additional etching to completely separate the N+ well into opposed portions. The remaining portion of the silicon oxide film 2 used for the etching step of FIG. 1a is usable as it is as a mask for the additional etching. With the present embodiment a P-type impurity element is implanted in the bottom of the trench 3 of increased depth to form a channel stopper 5 as shown in FIG. 1d.

Figure 1E:
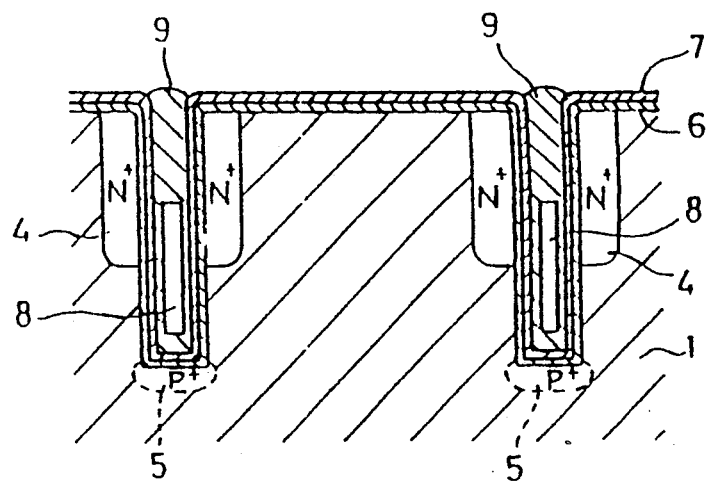

As seen in FIG. 1e, a silicon oxide film 6 and a silicon nitride film 7 are formed over the substrate after the silicon oxide film 2 has been removed therefrom, to cover the trench defining wall, and polysilicon 8 and silicon oxide 9 are buried in the trench 3. The trench 3 may alternatively be filled with silicon oxide only without using polysilicon. The burying step can be performed after the formation of the second silicon oxide film by depositing polysilicon on the substrate, etching away the deposit to cause the polysilicon to remain in the trench, and thereafter subjecting the polysilicon to thermal oxidation to convert the upper portion thereof to the oxide.

Figure 1F:
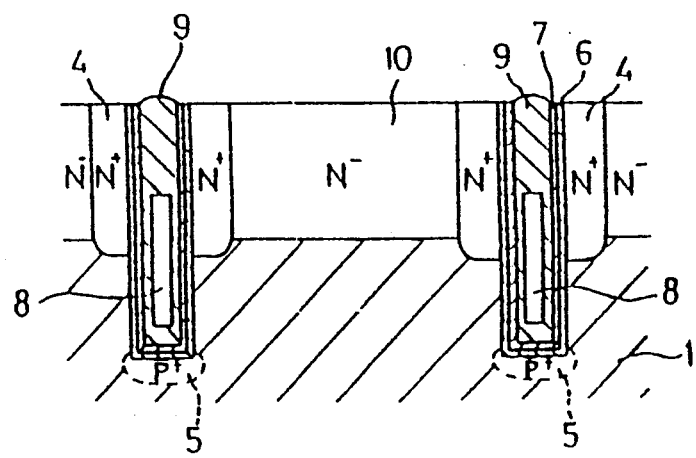

With reference to FIG. 1f, an N-type impurity element is diffused into the substrate 1 from the surface (to a concentration of $10^{15}$ to $10^{16}$ atoms/cm$^3$) to form an N$^-$ well 10. Alternatively, the N$^-$ well 10 can be formed before the trench 3 is formed as shown in FIG. 1a. In the latter case, the trench 3 to be formed by the first etching step preferably has such a depth that it will not extend through the N$^-$ well 10.

Figure 1I:
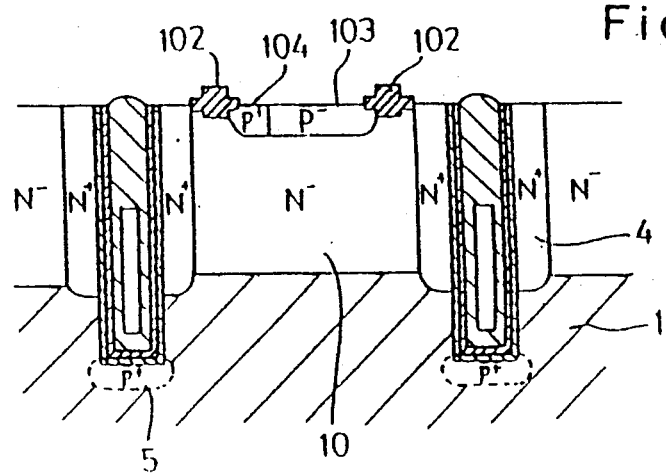
Figure 1J:
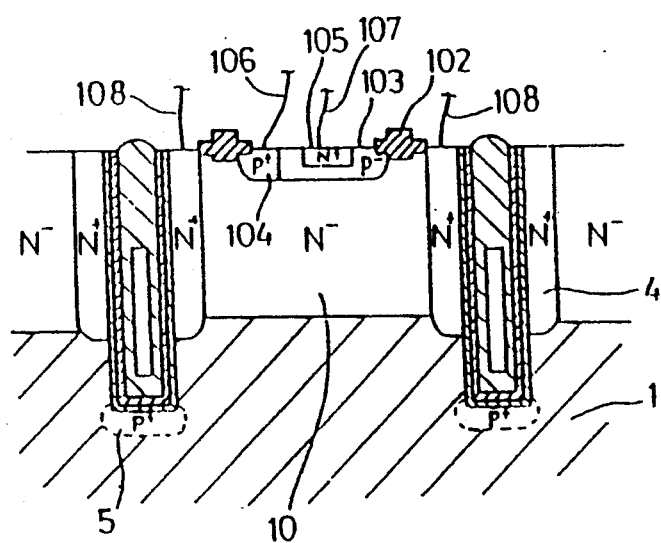
Figure 1G:
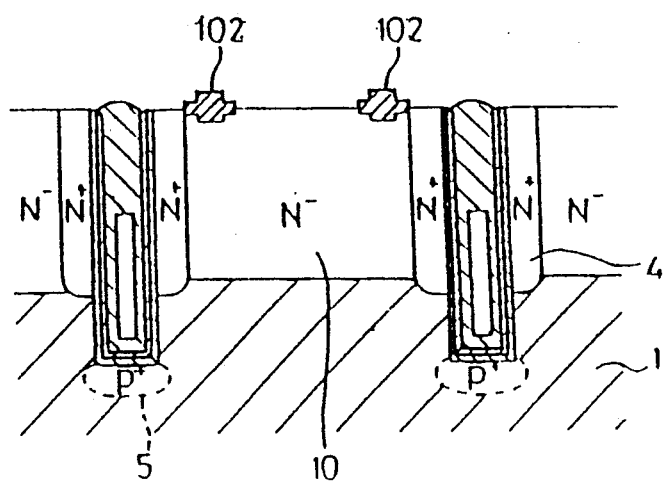

In the well thus formed, an NPN transistor is fabricated by the following steps. As seen in FIG. 1g, a LOCOS oxide film 102 is formed in the N$^-$ well 10.

Figure 1H:
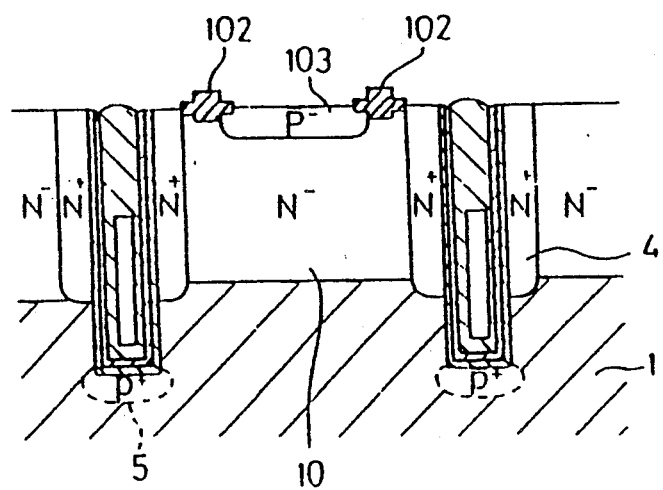

An active base region 103 is formed between the portions of LOCOS oxide film 102 illustrated in FIG. 1h. FIG. 1i shows a base contact portion 104 further formed. An emitter region 105 is formed by diffusion as shown in FIG. 1j, and base wiring 106, emitter wiring 107 and collector wiring 108 are connected to the base contact portion 104, the emitter region 105 and the impurity diffused region 4, respectively.

The collector wiring 108 is attached to the portion of the impurity diffused region 4 appearing at the substrate surface. This effectively reduces the collector resistance.

According to the embodiment described above, impurities are diffused through the entire trench defining inner wall to form a buried well, whereas it is also possible to form such a buried well by diffusing impurities from the bottom portion of the trench. Second third embodiments wherein impurities are diffused from the trench bottom portion will be described with reference to FIGS. 2a to 2k and FIGS. 3a to 3d, respectively.

The second embodiment will be described first. This embodiment, like the first embodiment, fabricates an NPN transistor in an N well formed.

Figure 2A:
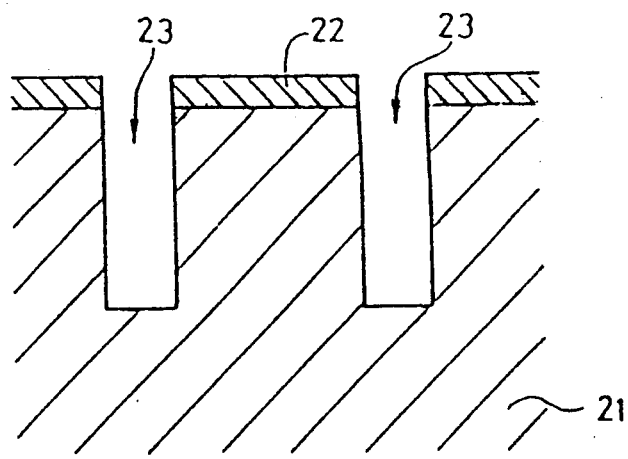
FIGS. 2a to 2k are fragmentary views in section showing a second embodiment of the invention stepwise.
Figure 2B:
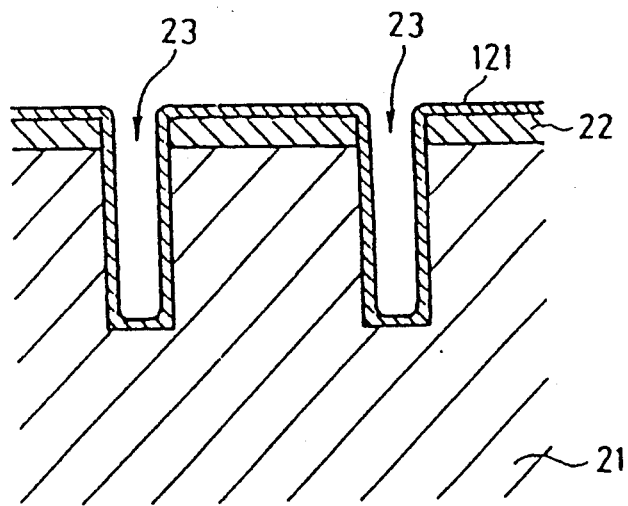

Referring to FIG. 2a, a patterned silicon oxide film 22 is formed over the surface of a P-type silicon substrate 21, and a trench 23 is then formed by anisotropic etching using the silicon oxide film 22 as a mask As shown in FIG. 2b, a protective film 121 is deposited over the substrate to cover the inner wall thereof defining the trench 23. The protective film 121 can be a silicon oxide film formed by thermal oxidation, a silicon oxide film or silicon nitride film formed by CVD, a double-layer structure of superposed silicon oxide film and silicon nitride film formed by CVD, or the like. A suitable film is selected from among these films in view of the conditions for the subsequent impurity diffusing step.

Figure 2C:
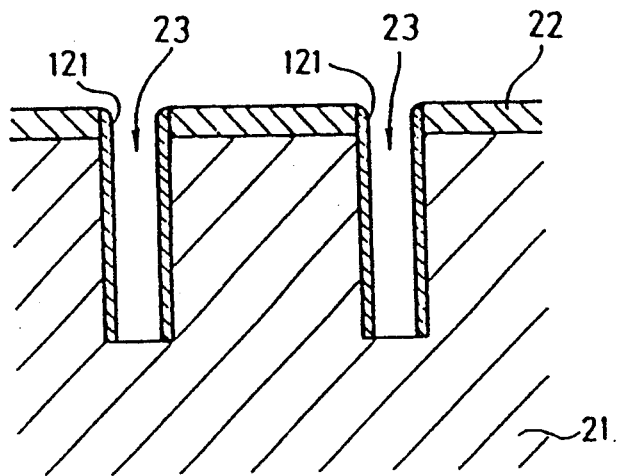

As seen in FIG. 2c, the portion of the protective film at the bottom of the trench 23 is removed by anisotropic etching.

Figure 2D:
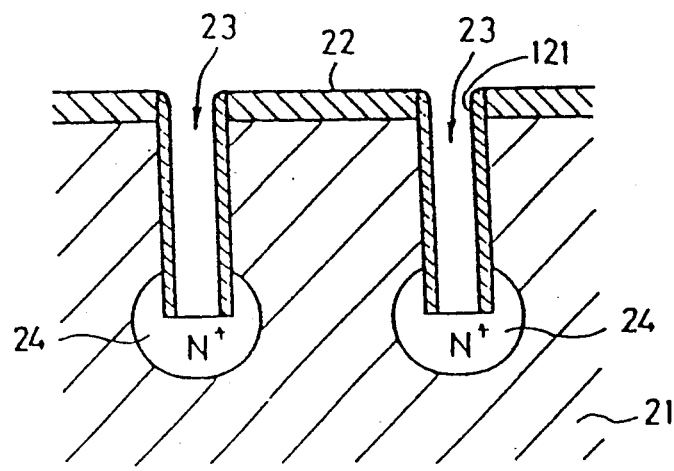

FIG. 2d shows a high-concentration impurity diffused region 24 formed by diffusing an N-type impurity element into the substrate from the bottom of the trench 23 from which the protective film 121 has been removed. The impurity element is diffused by the same method as used in the first embodiment.

Figure 2E:
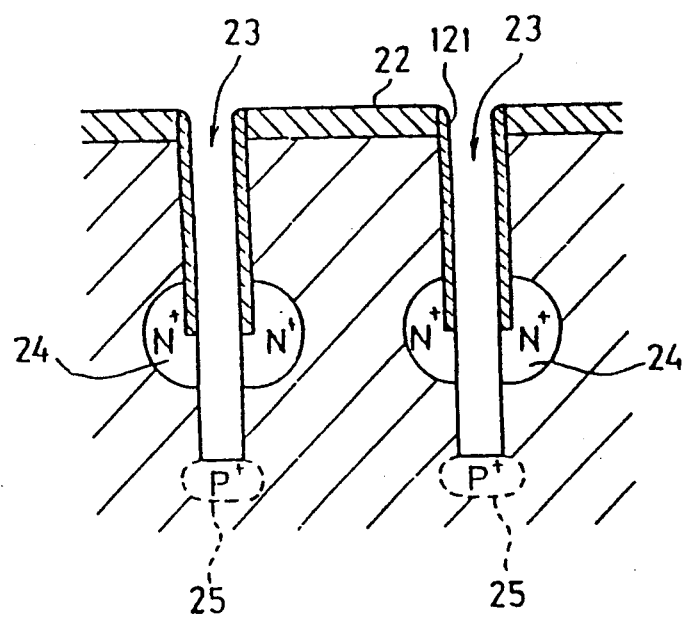

After the diffusion of impurities, the trench 23 is additionally etched as seen in FIG. 2e to give an increased depth to the trench 23 so that the trench 23 reaches the P-type substrate 21. A P-type impurity element is thereafter implanted in the bottom portion of the trench to form a channel stopper 25.

Figure 2F:
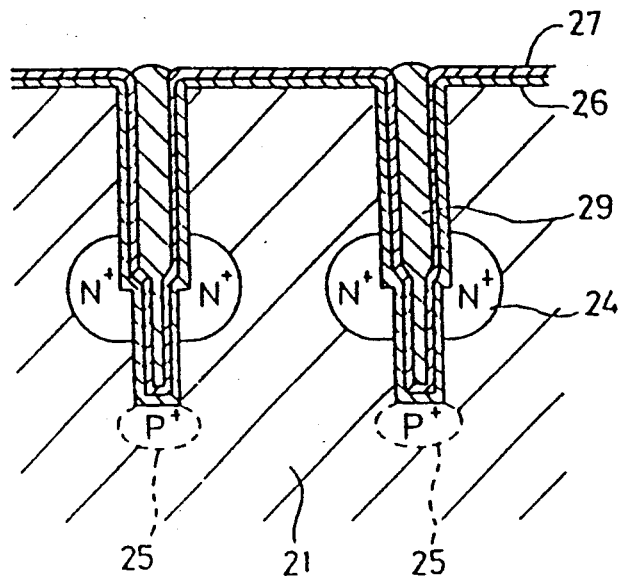

Subsequently, the protective film 121 and the silicon oxide film 22 serving as the mask for etching the trench 23 are removed, and silicon oxide 29 is then buried in the trench 23 as shown in FIG. 2f. In this step, the silicon oxide 29 is filled into the trench 23 after a silicon oxide film 26 and a silicon nitride film 27 are formed. Alternatively, the trench can be filled with polysilicon and silicon oxide as in the first embodiment.

Figure 2G:
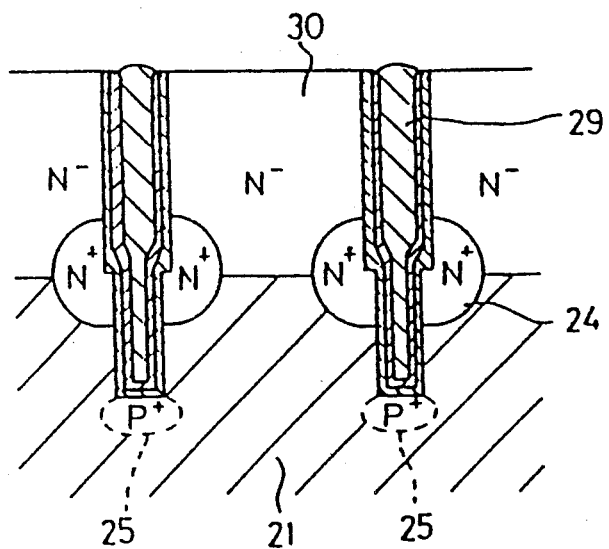

An N$^-$ well 30 is further formed as shown in FIG. 2g by introducing and diffusing an N-type impurity element into the substrate. The well 30 is so formed that the lower end thereof reaches the N-type impurity diffused region 24. The N+ well 30 may be formed before the trench 23 is formed by the first etching step. In the latter case, the trench 23 to be formed first should not extend beyond the bottom of the N$^-$ well 30.

Figure 2H:
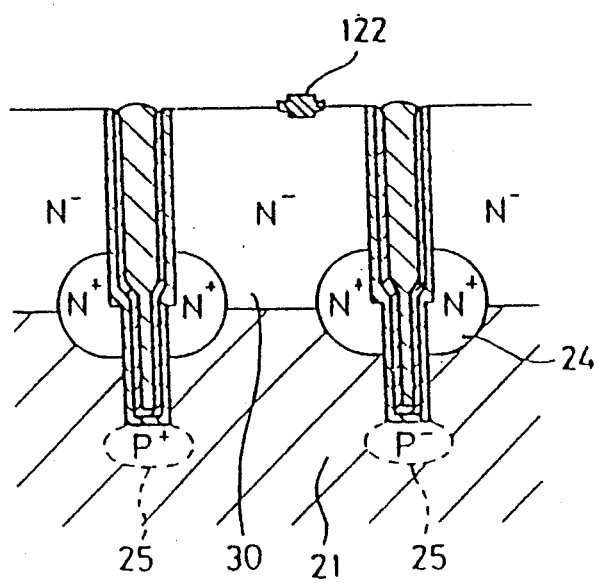

An NPN transistor is then formed. First, a LOCOS oxide film 122 is formed in the N$^-$ well 30 as seen in FIG. 2h.

Figure 2I:
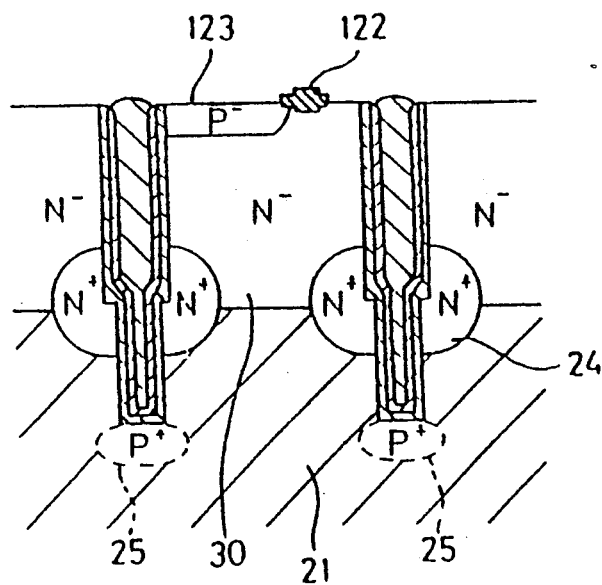

Next, an active base region 123 is formed as shown in FIG. 2i.

Figure 2J:
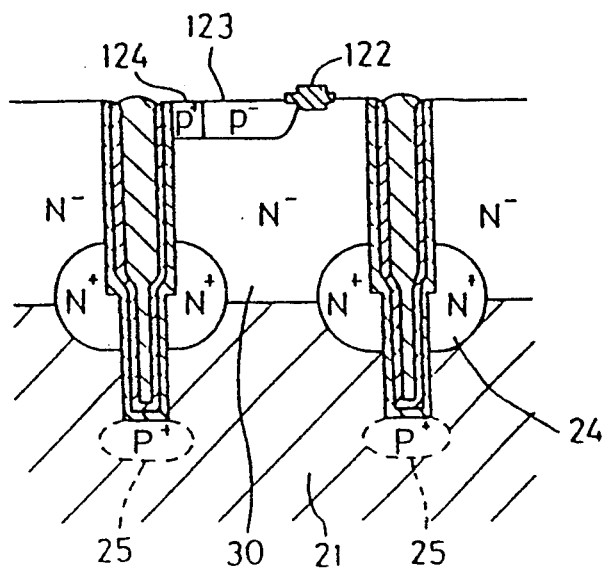
Figure 2K:
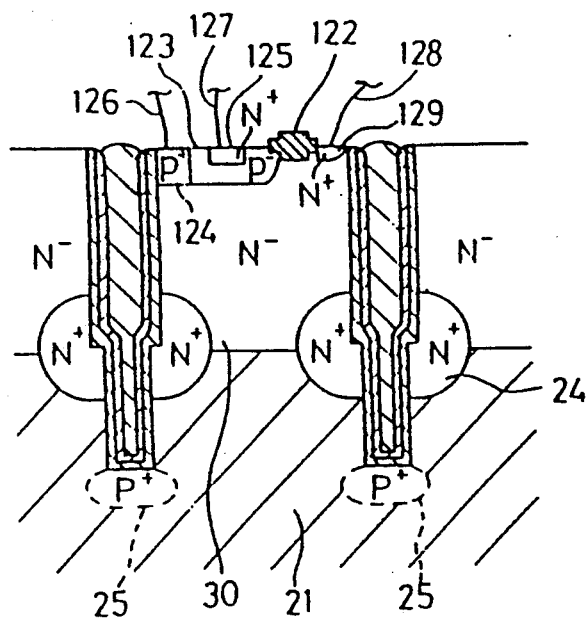

A base contact portion 124 is further formed as shown in FIG. 2j. Finally as shown in FIG. 2k, an emitter region 125 and a collector contact portion 129 are formed, and base wiring 126, emitter wiring 127 and collector wiring 128 are thereafter connected to the base contact portion 124, the emitter region 125 and the collector contact portion 129, respectively.

A MOS transistor or the like can of course be formed in the N$^-$ well 30.

According to the present embodiment, impurities are diffused from the portion of the trench defining inner wall from which the protective film 121 has been removed, i.e., from the bottom portion of the trench 23, to thereby form a buried well, and the depth of the trench 23 is increased by additional etching for well isolation. Consequently, the buried well can be formed efficiently with reduced well resistance and with a greatly decreased well isolation width.

Figure 3A:
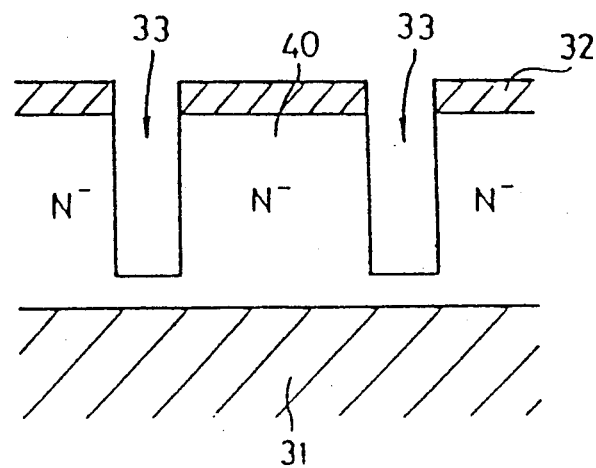
FIGS. 3a to 3d are fragmentary views in section showing a third embodiment of the invention stepwise.

The third embodiment shown in FIGS. 3a to 3d is a modification of the second embodiment. First as shown in FIG. 3a, an N$^-$ well 40 is formed by diffusing an N-type impurity element from the surface of a P-type semiconductor substrate 31, a patterned silicon oxide film 32 is formed over the surface of the substrate 31, and a trench 33 is thereafter formed by anisotropic etching with use of the silicon oxide film 32 as a mask.

Figure 3B:
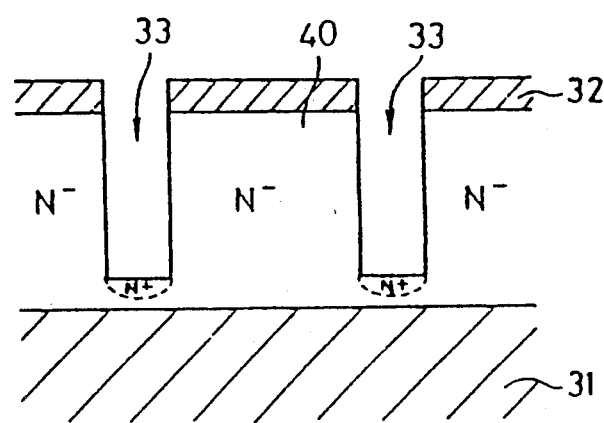
Figure 3C:
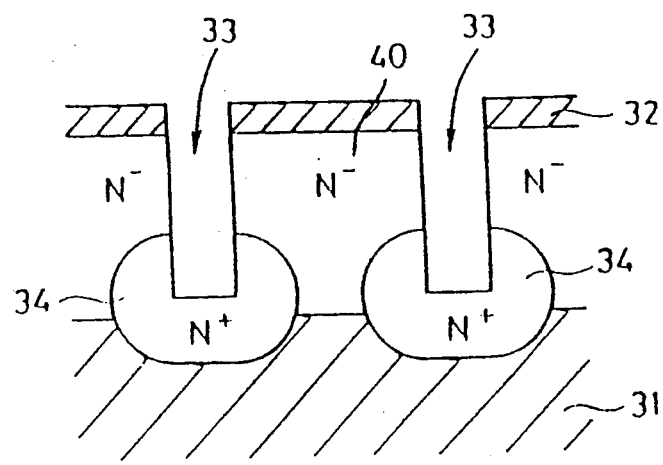

Next as seen in FIG. 3b, an N-type impurity element is introduced into the bottom portion of the trench 33 by ion implantation. A high-concentration impurity diffused region 34 is further formed by diffusion as shown in FIG. 3c.

Figure 3D:
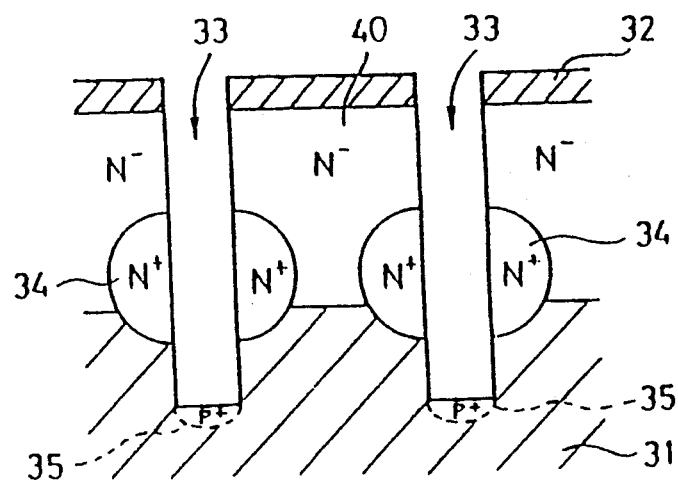

The trench 33 is given an increased depth by additional etching and thereby caused to reach the P-type substrate 31 as seen in FIG. 3d. A P-type impurity element is implanted in the bottom portion of the trench 33 to form a channel stopper 35. The remaining portion of the silicon oxide film 32 used for the first etching step of forming the trench 33 is usable as a mask for the additional etching and ion implantation, so that there is no need to form another masking film.

Silicon oxide is then buried in the trench 33 as in the second embodiment.

A bipolar transistor or MOS transistor can thereafter be formed in the N⁻ well in the same manner as in the second embodiment.

The present embodiment is adapted to diffuse impurities from the bottom portion of the trench 33 without using any protective film and is therefore a simpler process than the second embodiment. Incidentally, the N⁻ well can alternatively be formed after the substrate has been processed to the state of FIG. 3d.

The second and third embodiments are adapted to diffuse impurities from the substrate inner wall defining the trench 23 or 33 without affecting the impurity concentration of the substrate surface, are therefore greater than the first embodiment in the substrate surface area which is usable for forming semiconductor components and consequently afford semiconductor devices of higher complexity.

A fourth embodiment of the invention will be described with reference to FIGS. 4a to 4f.

Figure 4A:
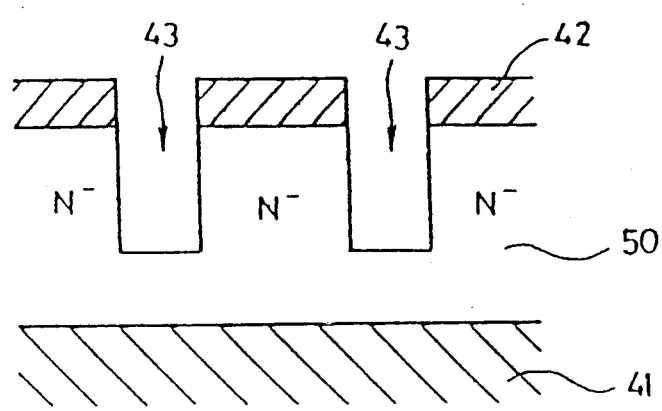
FIGS. 4a to 4f are fragmentary views in section showing a fourth embodiment of the invention stepwise.

As seen in FIG. 4a, a patterned silicon oxide film 42 is formed over a P-type silicon substrate 41 which is formed with an N⁻ well 50 by the introduction of an N-type impurity element, and a trench 43 is subsequently formed by anisotropic etching using the silicon oxide film 42 as a mask.

Figure 4B:
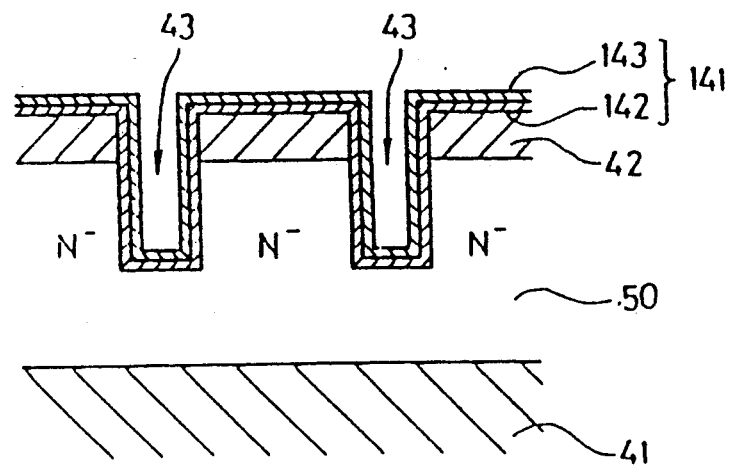

Next as shown in FIG. 4b, a protective film 141 comprising a silicon oxide film 142 and a silicon nitride film 143 is formed over the substrate to cover the inner wall thereof defining the trench 43. A silicon oxide film or silicon nitride film is usable singly as the protective film 141. The protective film to be used is selected according to the conditions for the subsequent impurity diffusing step.

Figure 4C:
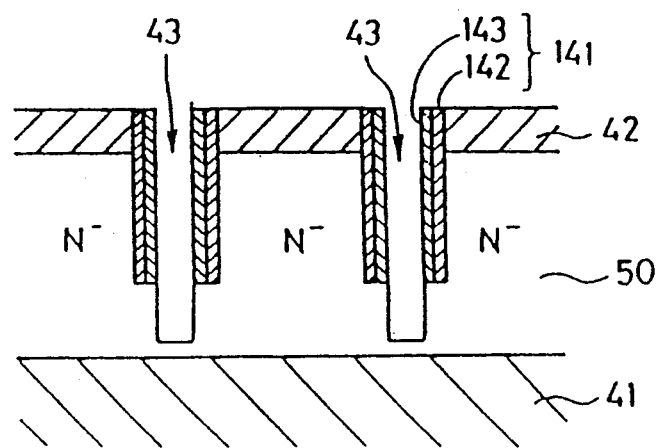

With reference to FIG. 4c, the protective film 141 is removed from the bottom portion of the trench 43, and the depth of the trench 43 is increased by additional etching, i.e., by anisotropic etching.

Figure 4D:
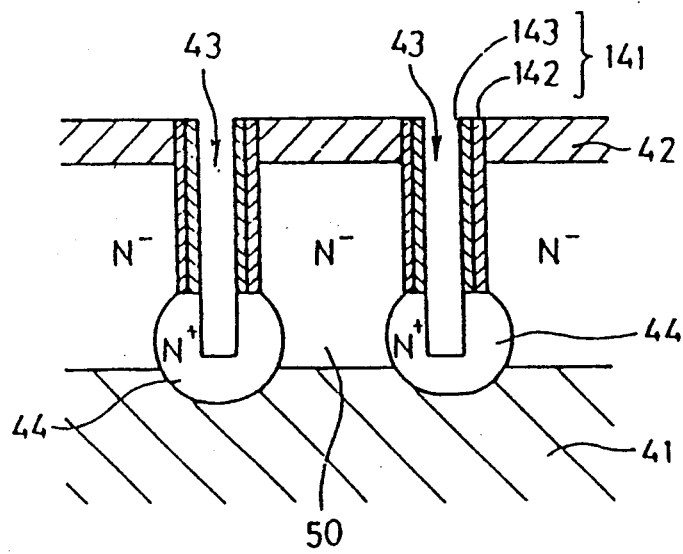

Next as shown in FIG. 4d, an N-type impurity element is diffused into the substrate from the exposed side surfaces and bottom surface defining the trench 43 to form a high-concentration impurity diffused region 44. The diffusion of the impurity element is done in the same manner as in the first embodiment.

Figure 4E:
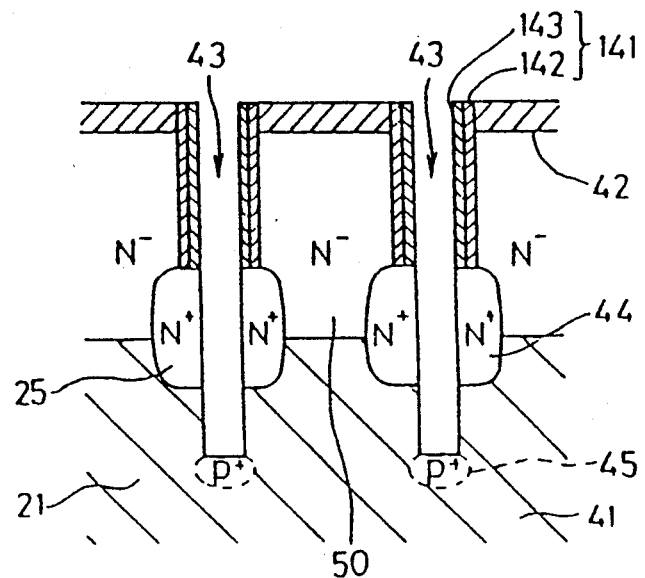

As shown in FIG. 4e, a further increased depth is given to the trench 43 by additional etching to cause the trench 43 to reach the P-type substrate 41. A P-type impurity element is implanted in the bottom portion of the resulting trench 43 to form a channel stopper 45.

Figure 4F:
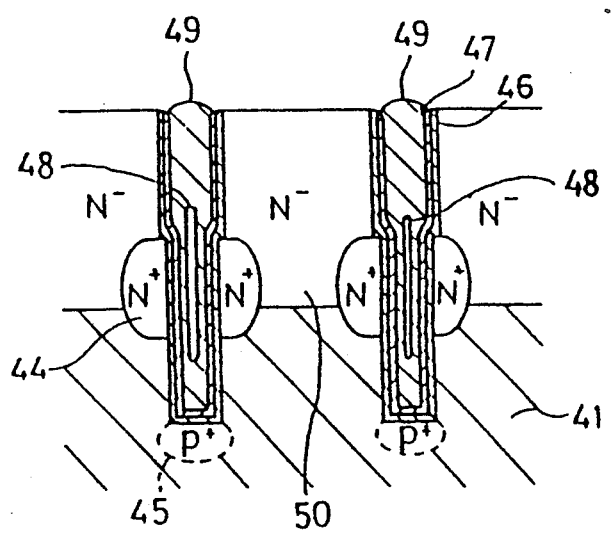
Figure 5A:
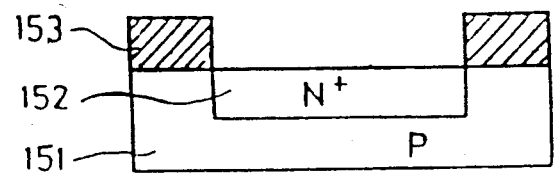
FIGS. 5a to 5h are fragmentary views in section showing stepwise a conventional process for producing a semiconductor device.
Figure 5B:
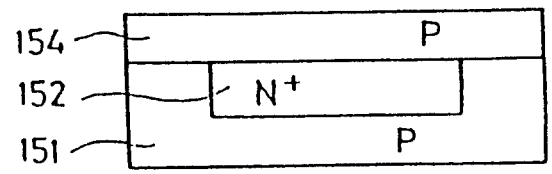
Figure 5C:
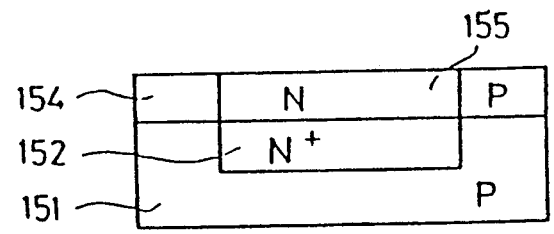
Figure 5D:
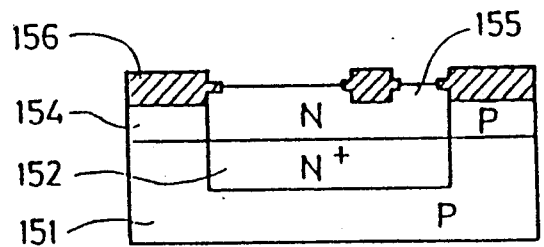
Figure 5E:
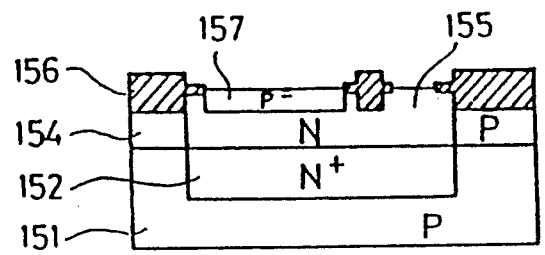
Figure 5F:
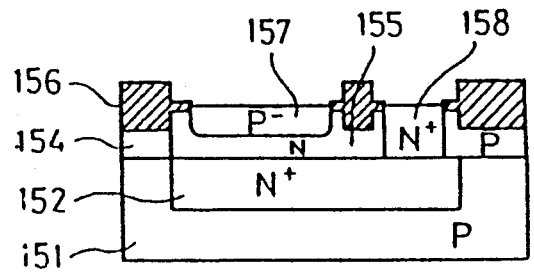
Figure 5G:
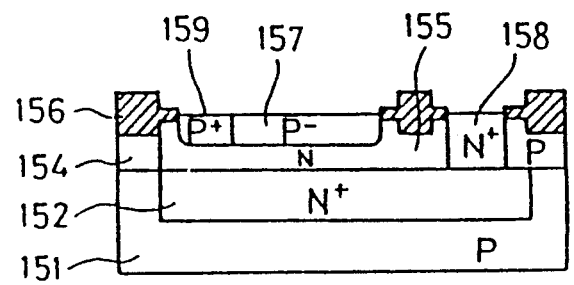
Figure 5H:
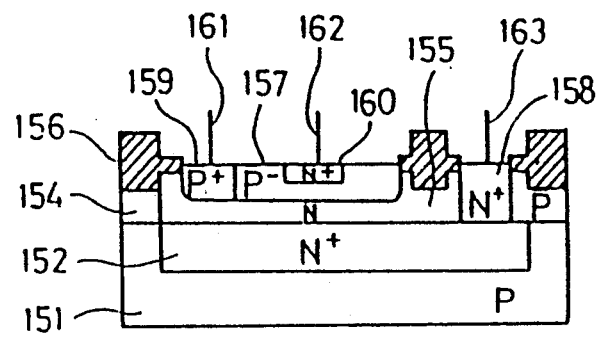

As seen in FIG. 4f, the trench 43 is filled with a silicon oxide film 46, silicon nitride film 47, polysilicon 48 and silicon oxide 49 after the protective film 141 and the silicon oxide film 42 have been removed. Silicon oxide only may be buried in the trench 43 without using polysilicon.

Subsequently, an NPN transistor can be formed in the N well 50 in the same manner as in the second embodiment. A MOS transistor of the like can of course be formed.

The N well 50 may be formed after the substrate has been processed to the state of FIG. 4f.

Since the fourth embodiment is adapted to diffuse impurities from portions of the trench defining side wall and the trench bottom portion, the length of the impurity diffused region 44 is easily controllable depthwise of the substrate. This results in the advantage that the well resistance can be fully decreased by giving an increases length to the impurity diffused region 44 depthwise of the substrate.

Although an N well is formed in P-type semiconductor substrates according to the foregoing embodiments, the present invention is of course applicable to the production of semiconductor devices of the conduction type reverse to the above type.

What we claim is:

1. A process for producing a bipolar semiconductor device comprising the steps of:
   (a) forming a trench having a depth defined by a surface comprising a side wall and a bottom in a semiconductor substrate having a conductive type at a portion where an isolating zone is to be formed;
   (b) doping the entire surface comprising said side wall and said bottom defining said trench with a conductive impurity different in conductive type from said semiconductor substrate to from a conductive impurity diffused region having a predetermined impurity concentration of said conductive impurity in said substrate, said conductive impurity diffused region being retained on said trench wall surface;
   (c) anisotropically etching said bottom of said trench to increase the depth of said trench to an increased depth, thereby dividing said conductive impurity diffused region to form an isolating zone and a collector region; and
   (d) doping a bottom surface of said trench having an increased depth with a conductive impurity identical in conductive type to said semiconductor substrate to form a channel stopper.

2. A process as defined in claim 1 wherein said substrate is doped with said conductive impurity by means selected from the group consisting of solid-phase diffusion and vapor-phase diffusion.

3. A process as defined by claim 1 further comprising forming another conductive impurity diffused region having an impurity concentration lower than said predetermined impurity concentration in said substrate by means selected from the group consisting of ion implantation and thermal diffusion from the surface of said substrate.

4. A process as defined in claim 1 further comprising, after step (d), forming a layer comprising silicon oxide which fills said trench.

5. A process as defined in claim 3, wherein said forming another impurity diffused region is performed prior to step (a).

6. A process as defined in claim 3, wherein said forming another impurity diffused region is performed after step (d).

7. A process as defined in claim 1 wherein said trench of said increased length in the step (c) is about 4 to 6 μm in depth.

8. A process as defined in claim 1, further comprising, after step (d), forming a base region and an emitter region in said isolating zone of said semiconductor substrate encompassed by said trench.

9. A process as defined in claim 1, wherein said conductive impurity diffused collector region has a substantially constant width which is substantially parallel to said sidewall.

10. A process as defined in claim 4, wherein said layer which fills said trench further comprises polysilicon.

* * * * *